United States Patent
Ogiwara et al.

(10) Patent No.: US 12,518,889 B2
(45) Date of Patent: Jan. 6, 2026

(54) CONDUCTIVE COMPOSITION, CONDUCTIVE PASTE, ELECTRIC CIRCUIT, FLEXIBLE ELECTRIC CIRCUIT BODY AND METHOD OF PRODUCING MOLDED BODY

(71) Applicant: NAMICS CORPORATION, Niigata (JP)

(72) Inventors: Toshiaki Ogiwara, Niigata (JP); Taku Fujino, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 18/272,229

(22) PCT Filed: Jan. 7, 2022

(86) PCT No.: PCT/JP2022/000294
§ 371 (c)(1),
(2) Date: Jul. 13, 2023

(87) PCT Pub. No.: WO2022/153925
PCT Pub. Date: Jul. 21, 2022

(65) Prior Publication Data
US 2024/0145113 A1    May 2, 2024

(30) Foreign Application Priority Data
Jan. 14, 2021  (JP) ................. 2021-004030

(51) Int. Cl.
*H01B 1/22* (2006.01)
*H05K 1/09* (2006.01)
*H05K 1/18* (2006.01)

(52) U.S. Cl.
CPC ............ *H01B 1/22* (2013.01); *H05K 1/095* (2013.01); *H05K 1/189* (2013.01)

(58) Field of Classification Search
CPC ...................................................... H01B 1/22
See application file for complete search history.

(56) References Cited

U.S. PATENT DOCUMENTS

| | | |
|---|---|---|
| 2001/0041249 A1 | 11/2001 | Sekine |
| 2013/0069016 A1 | 3/2013 | Dorfman |
| 2017/0200527 A1 | 7/2017 | Pujari et al. |
| 2019/0136046 A1* | 5/2019 | Nakano .......... H05K 1/092 |
| 2020/0176146 A1 | 6/2020 | Taga |
| 2021/0016541 A1 | 1/2021 | Tosaki et al. |
| 2021/0040344 A1 | 2/2021 | Takahashi |

FOREIGN PATENT DOCUMENTS

| | | | | |
|---|---|---|---|---|
| CN | 1316471 A | 10/2001 | | |
| JP | S61051052 A | 3/1986 | | |
| JP | H02245070 A | 9/1990 | | |
| JP | H02245071 A | 9/1990 | | |
| JP | 2008285518 A | 11/2008 | | |
| JP | 2011063791 A | 3/2011 | | |
| JP | 5146567 B2 | 2/2013 | | |
| JP | 2014086217 A * | 5/2014 | ............ | G06F 3/041 |
| JP | 2014531490 A | 11/2014 | | |
| JP | 2015069877 A | 4/2015 | | |
| JP | 2016204628 A | 12/2016 | | |
| JP | 2017126771 A | 7/2017 | | |
| JP | 2018041692 A | 3/2018 | | |
| JP | 2018104581 A | 7/2018 | | |
| JP | 2019139923 A | 8/2019 | | |
| JP | 2019189680 A | 10/2019 | | |
| JP | 2020055918 A | 4/2020 | | |
| JP | 2020094170 A | 6/2020 | | |
| TW | 201807012 A | 3/2018 | | |
| WO | 2015046096 A1 | 4/2015 | | |
| WO | 2017170079 A1 | 10/2017 | | |
| WO | 2019039209 A1 | 2/2019 | | |
| WO | 2021002278 A1 | 1/2021 | | |
| WO | WO 2019198624 A * | 4/2021 | ............ | H01B 1/22 |

OTHER PUBLICATIONS

International Search Report (ISR) (and an English language translation thereof) dated Mar. 22, 2022, issued in International Application No. PCT/JP2022/000294.
Written Opinion dated Mar. 22, 2022, issued in International Application No. PCT/JP2022/000294.
Extended European Search Report (EESR) dated Nov. 18, 2024, issued in counterpart European Application No. 22739334.5.
Taiwanese Office Action dated Feb. 2, 2025, issued in counterpart Taiwanese Application No. 111100771.
Japanese Office Action (and an English language translation thereof) dated May 13, 2025, issue in counterpart Japanese Application No. 2022-575558.
Japanese Office Action (and an English language translation thereof) dated Aug. 26, 2025, issued in counterpart Japanese Application No. 2022-575558.

* cited by examiner

*Primary Examiner* — Khanh T Nguyen
(74) *Attorney, Agent, or Firm* — Holtz, Holtz & Volek PC

(57) ABSTRACT

A conductive composition includes conductive particles, a thermoplastic resin, and a solvent, wherein a glass transition temperature of the thermoplastic resin is 140 to 200 degrees C.

12 Claims, No Drawings

CONDUCTIVE COMPOSITION, CONDUCTIVE PASTE, ELECTRIC CIRCUIT, FLEXIBLE ELECTRIC CIRCUIT BODY AND METHOD OF PRODUCING MOLDED BODY

FIELD OF THE INVENTION

The present invention relates to a conductive composition for forming an electrode and wirings, etc., of electric circuit and electronic circuit, etc.

BACKGROUND ART

In recent years, a conductive paste for forming an electrode and a wiring on a stretchable and bendable base material has been developed. In addition, attempts have been made to form an electrode and a wiring of an electric circuit and an electronic circuit with which thermal molding is possible, using a conductive paste.

For example, Patent Document 1 describes a polymer thick film conductive composition containing (a) 30 to 70 weight % silver, (b) a first organic medium, and (c) a second organic medium. Patent Document 1 also describes that (b) the first organic medium is (b) 10 to 40 weight % of the first organic medium comprising 10 to 50 weight % thermoplastic urethane resin dissolved in the first organic solvent, and the weight percentage of the thermoplastic urethane resin is based on the total weight of the first organic medium. Patent Document 1 also describes that (c) the second organic medium is 10 to 40 weight % of the second organic medium comprising 10 to 50 weight % thermoplastic polyhydroxy ether resin dissolved in the organic solvent, and the weight percentage of the thermoplastic polyhydroxy ether resin is based on the total weight of the second organic medium. In the polymer thick film conductive composition described in Patent Document 1, the weight percentage of the silver, the first organic medium and the second organic medium is based on the total weight of the polymer thick film conductive composition.

Patent Document 2 describes a resin composition containing conductive particles (A), a thermoplastic polyurethane resin (B) having a 100% modulus of 7 MPa or more, and a solvent (C). Patent Document 2 describes that a ratio of conductive particles (A) to the sum of conductive particles (A) and a thermoplastic polyurethane resin (B) is 90 to less than 100 weight %.

PRIOR ART DOCUMENTS

Patent Documents

Patent document 1: JP 2014-531490 A
Patent document 2: JP 2018-104581 A

DISCLOSURE OF THE INVENTION

In recent years, attempts have been made to form an electrode and a wiring, etc., (simply called an "electric wiring") of an electrical and/or electronic circuit on the surface of a base material that can be stretched and/or bent. In addition, attempts have been made to form electric wiring by molding using conductive paste. The technology to form an electric wiring by molding using conductive paste is called "in-Mold Electronics (IME)". During molding such as thermal molding, since an electric wiring is deformed by the stretching and/or bending of the base material (for example, a flat sheet or a film), there is a risk that the electric wiring of the electric circuit used for In-Mold Electronics becomes breaking.

As a conductive paste that forms the wiring of the electronic circuit on the surface of the base material that can be stretched and/or bent, attempts have been made to use a conductive paste containing a thermoplastic polyurethane resin. However, when thermal molding is performed for an electric wiring pattern formed using a conductive paste containing a thermoplastic polyurethane resin, it was found that a crack occurred in a thin wire pattern (for example, a thin wire of 1 mm width), causing the electric wiring to break.

Therefore, it is an object of the present invention to provide a conductive composition and a conductive paste capable of forming an electric wiring with low possibility of breaking even when the electric wiring of an electric circuit and/or an electronic circuit is stretched and/or bent. Moreover, it is an object of the present invention to provide a conductive composition and a conductive paste capable of forming an electric wiring with low possibility of breaking even when the electric wiring of an electric circuit and/or an electronic circuit is formed using molding.

To solve the above problems, the present embodiment of the present invention has the following configurations.

(Configuration 1)

Configuration 1 of the present embodiment is a conductive composition comprising: conductive particles (A); a thermoplastic resin (B); and a solvent (C),
wherein a glass transition temperature of the thermoplastic resin (B) is 140 to 200 degrees C.

(Configuration 2)

Configuration 2 of the present embodiment is the conductive composition of the configuration 1, wherein the thermoplastic resin (B) comprises a polycarbonate resin.

(Configuration 3)

Configuration 3 of the present embodiment is the conductive composition of the configuration 1 or 2, wherein the thermoplastic resin (B) comprises at least one selected from poly (4, 4'-cyclohexylidenediphenyl) carbonate and copoly [2, 2-bis (4-hydroxyphenyl) propane/2, 2-bis (4-hydroxy-3-methylphenyl) propane] carbonate.

(Configuration 4)

Configuration 4 of the present embodiment is the conductive composition of any of the configurations 1 to 3, wherein a boiling point of the solvent (C) is 200 degrees C. or more.

(Configuration 5)

Configuration 5 of the present embodiment is the conductive composition of any of the configurations 1 to 4, wherein the solvent (C) comprises at least one selected from isophorone, 3-methoxy N, N-dimethylpropanamide, benzyl alcohol, butyl carbitol, ethyl carbitol acetate and tetraglyme.

(Configuration 6)

Configuration 6 of the present embodiment is the conductive composition of any of the configurations 1 to 5, wherein weight ratio of the conductive particles (A) to the thermoplastic resin (B) (weight of the conductive particles (A):weight of the thermoplastic resin (B)) is 99:1 to 70:30.

(Configuration 7)

Configuration 7 of the present embodiment is the conductive composition of any of the configurations 1 to 6, wherein the conductive particles (A) are silver particles.

(Configuration 8)

Configuration 8 of the present embodiment is a conductive paste comprising the conductive composition of any of the configurations 1 to 7.

(Configuration 9)

Configuration 9 of the present embodiment is the conductive paste of configuration 8 for forming a flexible electric circuit body.

(Configuration 10)

Configuration 10 of the present embodiment is the conductive paste of the configuration 8, wherein the conductive paste is for In-Mold Electronics.

(Configuration 11)

Configuration 11 of the present embodiment is an electric circuit comprising a cured product of the conductive paste of any of the configurations 8 to 10.

(Configuration 12)

Configuration 12 of the present invention is a flexible electric circuit body comprising: a flexible base material; and the electric circuit of the configuration 11 arranged on the flexible base material.

(Configuration 13)

Configuration 13 of the present invention is a method of producing a molded body comprising: forming an electric circuit on a surface of a flexible base material using the conductive paste of any of the configurations 8 to 10; and forming the molded body by molding the flexible base material, on which the electric circuit was formed, and a resin for molding.

According to the present invention, a conductive composition and a conductive paste capable of forming an electric wiring with low possibility of breaking can be provided, even when the electric wiring of an electric circuit and/or an electronic circuit is stretched and/or bent. Moreover, according to the present invention, a conductive composition and a conductive paste capable of forming an electric wiring with low possibility of breaking can be provided, even when the electric wiring of an electric circuit and/or an electronic circuit is formed using molding.

MODE FOR CARRYING OUT THE INVENTION

Hereafter, embodiments of the present invention will be described specifically with reference to the drawings. It should be noted that the following embodiments are for embodying the present invention, and are not intended to limit the scope of the present invention.

A present embodiment is a conductive composition containing conductive particles (A), a thermoplastic resin (B), and a solvent (C). A glass transition temperature of the thermoplastic resin (B) contained in the conductive composition of the present embodiment is 140 to 200 degrees C.

Since the conductive composition (For example, a conductive paste) of the present embodiment contains the predetermined components, even when an electrode and a wiring, etc., (also simply called an "electric wiring") of an electric circuit and/or an electronic circuit (sometimes simply called an "electric circuit".) are stretched and/or bent, the electric wiring with low possibility of breaking can be formed. Moreover, the conductive composition (for example, conductive paste) of the present embodiment can be used for forming an electric wiring with low possibility of breaking even when forming the electric wiring with molding.

In this specification, a "flexible base material" means an object to be printed when printing an electric wiring pattern contained in an electric circuit using a conductive paste. In this specification, a flexible base material is also simply referred to as a "base material". In addition, since a "flexible base material" is generally often in the form of a flat sheet or a film, a flexible base material is sometimes referred to as a "flat sheet" or a "film". A preferred specific example of the flexible base material is a flat sheet (a film) made of polycarbonate resin, polyethylene terephthalate (PET) resin, and/or acrylic resin. The flexible base material is a base material with flexibility, which can be deformed, such as elongated and/or bent, when heated to at least a predetermined temperature. Thus, the flexible base material does not have to have flexibility at room temperature (e.g., below 30 degrees C.). The predetermined temperature when heated is, for example, 140 to 180 degrees C.

In this specification, a term "flexible electric circuit body" refers to a flexible base material (a flat sheet or a film) on which an electric wiring pattern (an electric circuit pattern) is printed using a conductive paste, and the printed conductive paste is dried and solidified. The flexible electric circuit body can be used for molding. The flexible electric circuit body containing the flexible base material is flexible when heated to at least a predetermined temperature. Therefore, the flexible electric circuit body does not have to have flexibility at room temperature (e.g., below 30 degrees C.). In a similar manner to the flexible base material, the predetermined temperature when heated is, e.g., 140 to 180 degrees C.

In this specification, a "molded body" refers to a flexible electric circuit body (a flat sheet or a film with an electric wiring pattern) molded together with other resin (a resin for molding). Molding refers to a processing method for processing a material into a predetermined shape using a mold, such as heat molding, pressure molding and vacuum molding.

The conductive paste of the present embodiment is preferably a conductive paste for In-Mold Electronics. In general, a technique in which a flat sheet-like or a film-like base material is bonded together at the same time as molding is called In-Mold. In addition, there is a technique called In-Mold Electronics (IME) using the In-Mold. The In-Mold Electronics is a technique to form an electric wiring pattern on a flat sheet-like or film-like base material (a flexible electric circuit body) and mold it by In-Mold to produce a molded body with an integrated electric wiring. By using the conductive paste of the present embodiment, even when a base material is stretched and/or bent, it is possible to form an electric wiring with low possibility of breaking. Therefore, the conductive paste of the present embodiment can be preferably used as a conductive paste for In-Mold Electronics.

Next, the conductive composition of the present embodiment will be described.

<Conductive Particles (A)>

The conductive composition of the present embodiment contains conductive particles as a component (A).

The conductive particles contained in the conductive composition of the present embodiment preferably contain at least one selected from silver (Ag), gold (Au), copper (Cu), palladium (Pd), nickel (Ni), titanium (Ti) and carbon (C). When the conductive particles contain the predetermined metal, an electric wiring with low electrical resistance can be formed. It is more preferable that the conductive particles contained in the conductive composition of the present embodiment consist of at least one selected from silver (Ag), gold (Au), copper (Cu), palladium (Pd) and carbon (C). Especially, silver (Ag) has high electrical conductivity. Therefore, silver (Ag) particles (that is, conductive particles consisting of silver) are preferably used as the conductive particles. An electric wiring with low electrical resistance can be formed by using the silver particles as the conductive particles.

In this specification, for example. "conductive particles consisting of silver" means that no component other than silver is intentionally added, and impurities that are inevitably contained are allowed to be contained in the conductive particles. The same applies to conductive particles consisting of metals other than silver and components other than conductive particles.

The particle shape and particle size (also called particle-diameter or particle diameter) of conductive particles are not particularly limited. For example, spherical shape, scale shape and the like can be used as the particle shape. The particle size of conductive particles can be specified by the cumulative 50% particle size of the all particles (D 50). In the specification, D 50 is also referred to as the average particle size. The average particle size (D 50) may be determined from the result of the particle size distribution measurement by the Microtrack method (laser diffraction scattering method).

The average particle size (D 50) of the conductive particles is preferably 0.1 to 30 micrometers, more preferably 0.2 to 20 micrometers, even more preferably 0.5 to 15 micrometers, and especially preferably 0.8 to 10 micrometers in view of the resistance to stretching and/or bending and workability. If the average particle size (D 50) is larger than the above range, problems such as clogging may occur during screen printing. In addition, if the average particle size is smaller than the above range, particles may be over-sintered during firing, which makes it difficult to form an electric wiring that is resistant to stretching and/or bending.

In addition, the size of conductive particles can be expressed as a BET value (BET specific surface area). The BET value of conductive particles is preferably 0.1 to 10 $m^2/g$, more preferably 0.2 to 5 $m^2/g$, and even more preferably 0.5 to 3 $m^2/g$.

<Thermoplastic Resin (B)>

The conductive composition of the present embodiment contains a thermoplastic resin as a component (B).

A glass transition temperature of the thermoplastic resin contained in the conductive composition of the present embodiment is 140 to 200 degrees C., preferably 140 to 190 degrees C. The glass transition temperature of the thermoplastic resin can be measured by differential scanning calorimetry (DSC). The typical temperature for heat molding of In-Mold Electronics is 140 to 180 degrees C., temperature for pressure molding is 140 to 160 degrees C., and temperature for vacuum molding is 180 degrees C. A resin component having a glass transition temperature similar to or higher than the temperature during the molding is used as a resin component of the conductive paste, a, the flat sheet (film) and the conductive paste can follow well each other during molding. Therefore, even if an electric wiring pattern is deformed during molding, a possibility of breaking of the electric wiring can be reduced.

The conductive composition of the present embodiment preferably contains a polycarbonate resin as a thermoplastic resin (B) with a glass transition temperature of 140 to 200 degrees C. The thermoplastic resin more preferably consists of a polycarbonate resin.

During molding, a molded body with electric wiring can generally be produced by printing a predetermined electric wiring on a flat sheet (film) of polycarbonate resin and using the flat sheet for molding. When the thermoplastic resin contains polycarbonate resin, the electric wiring can well follow a deformation of the flat sheet during molding. Therefore, a possibility of breaking of the electric wiring can be reduced.

The present inventors found that, when an electric wiring pattern formed using a conductive paste containing a thermoplastic polyurethane resin is used for heat molding, cracks occur in a thin wire pattern (for example, a thin wire of 1 mm width), resulting in breaking of an electric wiring.

Therefore, the present inventors studied various materials used in the conductive paste for forming an electric wiring by heat molding. The present inventors found that when a thermoplastic resin with a glass transition temperature of 140 to 200 degrees C. is used as a thermoplastic resin contained in the conductive paste, an electric wiring with low possibility of breaking could be formed by heat molding, with which the present inventors arrived at the present invention. In In-Mold Electronics, a base material (a flat sheet or a film) on which an electric wiring pattern is printed using a conductive paste is used for molding. The material of the base material is not particularly limited as long as the base material can be heat-molded. The material of the base material is preferably a base material using polycarbonate resin, polyethylene terephthalate (PET), acrylic resin and the like. When the material of the base material is polycarbonate resin, by using the same kind of material as the thermoplastic resin contained in the conductive paste of the present embodiment, a deformation of an electric wiring pattern during heat molding can easily follow a deformation of a flat sheet or a film. Therefore, a possibility of breaking of the electric wiring can be reduced. In particular, by making the glass transition temperature and softening temperature of the resin component of the conductive paste comparable to the material of the base material (a flat sheet or a film), the elongation of a flat sheet or a film during heat molding can properly follow the elongation of the resin component of the conductive paste. Therefore, a possibility of breaking of the electric wiring can be reduced.

The thermoplastic resin (polycarbonate resin) contained in the conductive composition of the present embodiment preferably contains at least one selected from poly (4, 4'-cyclohexylidenediphenyl) carbonate and copoly [2, 2-bis (4-hydroxyphenyl) propane/2, 2-bis (4-hydroxy-3-methylphenyl) propane] carbonate (that may be referred to a "predetermined polycarbonate resin"). Two or more different types of thermoplastic resin (polycarbonate resin) can be used as the thermoplastic resin.

The molecular weight of the polycarbonate resin contained in the thermoplastic resin is preferably 10,000 to 100,000, more preferably 10,000 to 80,000, and even more preferably 10,000 to 60,000. When the molecular weight of the polycarbonate resin is high, it is necessary to increase a blending amount of a solvent to achieve a predetermined viscosity. When a blending amount of a solvent is high, a problem arises in that the film thickness of the coating film becomes thin. When the molecular weight of the thermoplastic resin (polycarbonate resin) is in the above range, the viscosity, elongation characteristics during heating and the electrical resistance value of a cured product can be balanced and appropriate.

Some types of polycarbonate resin has high crystalline nature. A polycarbonate resin with high crystalline nature has a problem of crystallization when the polycarbonate resin is dissolved by heat in a solvent and then returned to room temperature. It is not easy to use such a polycarbonate resin as a resin component of a conductive paste. On the other hand, the predetermined polycarbonate resin described above can be dissolved in a predetermined solvent, for example, a solvent such as isophorone having a high boiling point, and can avoid the problem of crystallization after returning to room temperature. Therefore, by using the polycarbonate resin as the thermoplastic resin, a possibility of breaking of an electric wiring can be further reduced.

When the conductive paste contains the polycarbonate resin, an electric wiring pattern can be easily printed on a surface of a flexible base material made of the polycarbonate resin. Also, an electric wiring pattern can be easily printed on a surface of a base material made of a material other than the polycarbonate resin.

In the conductive composition of the present embodiment, the weight ratio of the conductive particles (A) to the thermoplastic resin (B) (weight of the conductive particles (A):weight of the thermoplastic resin (B)) is preferably 99:1 to 70:30, more preferably 98:2 to 75:25, and even more preferably 98:2 to 80:20. By setting the weight ratio of the conductive particles to the thermoplastic resin in an appropriate range, a shape of a printed pattern of an electric wiring can be kept appropriate, and an electrical resistance of the electric wiring can be lowered.

The conductive composition of the present embodiment can contain other resins, such as thermoplastic resins, thermosetting resins and/or photocuring resins, to the extent that does not interfere with the effect. However, in order to obtain a suitable electric wiring, a resin contained in the conductive composition is preferably a resin consisting of a thermoplastic resin with a glass transition temperature of 140 to 200 degrees C., and more preferably consists of a polycarbonate resin.

<Solvent (C)>

The conductive composition of the present embodiment contains a solvent as a component (C).

The conductive composition of the present embodiment preferably has a boiling point of the solvent between 200 and 300 degrees C. Polycarbonate resin can be dissolved by using a solvent with a high boiling point, such as isophorone.

Moreover, when the boiling point of the solvent is equal or more than the predetermined temperature, the drying time can be set to an appropriate duration without shortening the drying time after screen-printing an electric wiring pattern using conductive paste. Therefore, it is easier to deform the electric wiring pattern following a deformation of a flat sheet or a film during molding. If a boiling point of the solvent exceeds 300 degrees C., the solvent may not be sufficiently removed during drying and heating for molding.

The solvent specifically preferably contains at least one selected from isophorone, 3-methoxy N, N-dimethylpropanamide, benzyl alcohol, butyl carbitol, ethyl carbitol acetate and tetraglyme. The polycarbonate resin can be reliably dissolved with these predetermined solvents. Moreover, a possibility of breaking of a resulting electric wiring can be further reduced by the conductive paste containing the predetermined solvent. In particular, when poly (4, 4'-cyclohexylidenediphenyl) carbonate and/or copoly [2, 2-bis (4-hydroxyphenyl) propane/2, 2-bis (4-hydroxy-3-methylphenyl) propane] carbonate are dissolved in a solvent as a thermoplastic resin, the above-mentioned solvent can be preferably used. Therefore, paste-forming of the conductive composition is facilitated, and the possibility of breaking of a resulting electric wiring can be reduced.

The solvent preferably contains isophorone. By using isophorone as the solvent, the polycarbonate resin can be more easily dissolved in the solvent. In addition, since a boiling point of isophorone is 215 degrees C., it can be said that the boiling point of the solvent is suitable for printing a conductive paste. In addition, the conductive paste containing the solvent of isophorone is difficult to gel or solidify even if the conductive paste is placed and left, and has advantages that it is not separating to solid and liquid during printing, and the like. Therefore, the solvent preferably contains isophorone, and more preferably consists of isophorone only. Especially when poly (4, 4'-cyclohexylidenediphenyl) carbonate and/or copoly [2, 2-bis (4-hydroxyphenyl) propane/2, 2-bis (4-hydroxy-3-methylphenyl) propane] carbonate are dissolved in a solvent as a thermoplastic resin, a solvent containing isophorone can be preferably used.

The added amount of a solvent is preferably 50 to 1000 parts by weight, more preferably 80 to 900 parts by weight, and even more preferably 100 to 800 parts by weight, relative to 100 parts by weight of the thermoplastic resin. Usually, the thermoplastic resin can be properly dissolved by using a solvent of about 4 times the weight of the thermoplastic resin.

The solvent can be additionally added to the conductive composition as needed to adjust the viscosity of the conductive composition.

<Conductive Paste>

The present embodiment is a conductive paste containing the conductive composition described above.

A conductive paste of the present embodiment can be a conductive paste consisting only of the conductive composition containing the conductive particles (A), the thermoplastic resin (B) and the solvent (C) described above. However, the conductive paste of the present embodiment can contain components other than the conductive composition described above, to the extent that does not interfere with the effect of the invention or to enhance the effect of the invention. For example, the conductive paste of the present embodiment can further contain at least one selected from the group consisting of inorganic pigments, organic pigments, silane coupling agents, leveling agents, thixotropic agents and defoaming agents.

The conductive paste of the present embodiment can be produced by putting the components contained in the above conductive composition, with other components that is added in some cases, into a mixer such as a planetary stirring machine, a dissolver, a bead mill, a grinding kneader, a three-roll mill, a rotary mixer, or a twin-screw mixer, and mixing the components. In this way, the conductive paste can be prepared suitable for screen printing, immersion or other methods of forming a desired coating or an electric wiring.

A viscosity of the conductive paste in the present embodiment can be adjusted to a viscosity that can be properly used for the predetermined method of forming a coating or an electric wiring such as screen printing. The adjustment of the viscosity can be made by properly controlling an amount of a solvent.

The viscosity of the conductive paste of the present embodiment is preferably 10 to 1000 Pa·second, more preferably 20 to 700 Pa·second, and more preferably 25 to 600 Pa·second. The viscosity can be measured by a viscometer (B-type) manufactured by Brookfield Corporation using an SC4-14 spindle (Utility Cup and Spindle (UC/S)=#14) at a speed of 10 rpm and a measuring temperature of 25 degrees C.

By using the conductive paste of the present embodiment, an electric circuit and/or an electric wiring of an electronic circuit with low possibility of breaking can be formed on a surface of a base material which can be stretched and/or bent by means of screen printing or the like.

The present embodiment is an electric circuit containing a cured product of a predetermined conductive paste. In this specification, a cured product is a product obtained by printing the conductive paste of the present embodiment in a predetermined pattern and heat-drying it at, for example, 120 degrees C. for 30 minutes. The cured product can be used as an electric wiring of an electric circuit or the like. Therefore, an electric circuit with low possibility of breaking can be formed using the conductive paste of the present embodiment. The heating of the conductive paste for producing the cured product may not be the final heating.

In the present specification, a resulting product by printing an electric circuit pattern on a flexible base material (for example, a flat sheet or a film made of polycarbonate resin), and drying the printed conductive paste may be referred to as a flexible electric circuit body. The flexible electric circuit body includes a flexible base material and an electric circuit arranged on the flexible base material.

The conductive paste of the present embodiment can be preferably used as a conductive paste for forming the flexible electric circuit body. A molded body containing the desired electric circuit can be produced by using the flexible electric circuit body of the present embodiment for molding.

Temperature and time for drying the electric wiring pattern of the conductive paste can be appropriately selected depending on a type of thermoplastic resin contained in the conductive composition. The temperature and the time for curing the conductive paste can be determined by adjusting appropriately, taking into account heat tolerance of the base material. For example, the temperature and the time for drying the conductive paste can be from 3 to 60 minutes at 60 to 160 degrees C., preferably from 3 to 60 minutes at 80 to 150 degrees C., and more preferably from 3 to 30 minutes at 100 to 130 degrees C. A cured product of the electric wiring pattern can be obtained by drying the electric wiring pattern at the predetermined temperature and time.

<Molded Body>

A molded body of the present embodiment can be produced by molding a flexible electric circuit body together with another resin (a resin for molding). That is, the molded body of the present embodiment includes an electric circuit. The technology for producing the molded body including the electric circuit is called In-Mold Electronics. Therefore, the conductive paste of the present embodiment can be preferably used as a conductive paste for In-Mold Electronics.

The molded body of the present embodiment is preferably molded by heat molding. By heating the wiring pattern using the conductive paste of the present embodiment formed in the flexible electric circuit body, it becomes possible to extend and bend. Since the flexible electric circuit body of the present embodiment, including the electric circuit, is flexible, it can be formed into a desired shape by heat molding.

In the method of producing the molded body by In-Mold Electronics of the present embodiment, firstly, the electric circuit is formed on a surface of the flexible base material using the conductive paste of the present embodiment described above. Then, the molded body can be formed by molding the flexible base material on which the electric circuit is formed (a flexible electric circuit body) and a resin for molding.

Specifically, an example of the producing process of the molded body by In-Mold Electronics is as follows.

Firstly, the conductive paste of the present embodiment described above is produced.

Then, the conductive paste of the present embodiment is printed on a surface of a flexible base material (for example, a flat sheet or a film made of polycarbonate resin) to form a printed pattern (an electric circuit pattern).

Then, the printed pattern (the electric circuit pattern) of the conductive paste printed on the flexible base material is heated and dried to produce a flexible electric circuit body. The drying conditions can be, for example, a heating temperature of 120 degrees C. and a heating time of 30 minutes.

Next, the flexible electric circuit body on which the electric circuit formed is molded into a three-dimensional shape by heat molding, pressure molding or vacuum molding. In the molding such as the heat molding, a heating temperature of the flexible electric circuit body is preferably 140 to 180 degrees C.

Next, the flexible electric circuit body formed into the three-dimensional shape and a resin for molding are integrally molded by molding such as heat molding, pressure molding or vacuum molding. The heating temperature during the integral molding is preferably 140 to 180 degrees C.

Through the above process, a molded body by In-Mold Electronics can be produced. According to the producing method of the molded body of the present embodiment, a molded body having an electric circuit with low possibility of breaking can be produced by molding.

EXAMPLES

The present invention will be described in detail below with reference to examples, but the present invention is not limited to these.

<Materials and Preparation Ratio of Conductive Paste>

Tables 1 and 2 show the compositions of the conductive pastes of Examples 1 to 14 and Comparative Examples 1 and 2. The compositions indicate as weight relative to 100 parts by weight of the conductive particles. The conductive pastes of the Examples and the Comparative Examples are conductive compositions consisting of silver particles (conductive particles), a thermoplastic resin(s) and a solvent(s).

<Conductive Particles (A)>

In the Examples and the Comparative Examples, silver particles were used as the conductive particles. Table 3 shows the manufacturer and model number, particle shape, average particle size (D 50), tap (TAP) density and specific surface area of silver particles A to E (conductive particles A to E) used in the Examples and the Comparative Examples. The tap density is the "bulk density" obtained after mechanical tapping of a container containing powder samples.

<Thermoplastic Resin (B)>

Table 4 shows the manufacturer and model number, model number, molecular weight and glass transition temperature of resins A to F used as the thermoplastic resin in the Examples and the Comparative Examples.

<Solvent (C)>

Table 5 shows the manufacturer and model number, solvent type and boiling point of the solvents A to F used in the Examples and the Comparative Examples. The thermoplastic resin(s) was mixed with conductive particles after the thermoplastic resin(s) was dissolved in the solvent.

<Preparation of Conductive Paste>

Next, the conductive paste was prepared by pasting with mixing the materials in the predetermined preparation ratio mentioned above in a planetary mixer and dispersing them in a three-roll mill.

<Measuring Method of Viscosity>

The viscosity of the conductive paste of the Examples and the Comparative Examples was measured by a viscometer (B type) manufactured by Brookfield at a measuring temperature of 25 degrees C. using an SC4-14 spindle (Utility Cup and Spindle (UC/S)=#14) at a speed of 10 rpm. The measurement results are shown in Tables 1 and 2.

<Measuring Method of Resistivity>

A sheet-like flexible flat sheet (a film) made of polycarbonate resin was used as a base material. The size of the base material was 10 cm×2 cm and the thickness was 250 micrometers. The base material can be deformed (stretched) at a temperature of 160 degrees C. A wiring pattern (width: 3 mm, length: 50 mm) of the conductive paste (the conductive composition) of the Examples and the Comparative Examples was printed on a surface of the base material. The measurement of the electrical resistance value, described later, was performed with electrodes arranged at both ends in the length direction of 50 mm. A screen printing machine was used for printing. After printing, it was heat-dried at 120 degrees C. for 30 minutes in a constant temperature dryer. The film thickness of the cured product of the obtained wiring pattern (simply called a "wiring pattern") was 10 microns. The film thickness was measured using a surface roughness profile measuring machine (model number: SURFCOM 1500 SD-2) manufactured by Tokyo Seimitsu Co., Ltd.

First, the electrical resistance values (initial resistance values) of the wiring patterns of the Examples and the Comparative Examples were measured without stretching by placing electrodes at both ends of 50 mm in the length direction and energizing them. The electrical resistance values of the wiring patterns were measured by the 4-terminal method using a 7461 A digital multimeter manufactured by ADC. The specific resistance was calculated from the electrical resistance values and the dimensions of the wiring patterns. Tables 1 and 2 show initial specific resistance values calculated from the initial resistance values of the Examples and the Comparative Examples.

Next, while measuring the electrical resistance value of the wiring pattern, the wiring pattern was lengthened in the length direction (in the length direction of the pattern with a length of 50 mm) at a temperature of 160 degrees C. until it reached 100% elongation (the length after elongation was 100 mm). The values in the column of "Rate of change in resistance at 100% stretch against initial resistance (times)" in Tables 1 and 2 are shown as the values of the resistance values after elongation divided by the initial resistance values of the Examples and the Comparative Examples. The Comparative examples 1 and 2 were broken during elongation. Therefore, the elongation rates when the wires were broken ([elongation length–initial length 50 mm]/initial length 50 mm) are shown for the Comparative Examples 1 and 2.

Measured Results of the Examples and the Comparative Examples

The conductive pastes of the Examples 1 to 14 contain the thermoplastic resins (the polycarbonate resin of resins A to D) with the glass transition temperatures of 140 to 200 degrees C. as the thermoplastic resin. Therefore, the wiring patterns of the Examples 1 to 14 did not break at 100% elongation, and the resistance change rate at 100% elongation to the initial resistance was less than 54 times. In the case of the Examples 1 to 4 and 6 to 14 using only thermoplastic resin (the polycarbonate resin of resins A to D) with a glass transition temperature of 140 to 200 degrees C. the resistance change rate at 100% elongation to the initial resistance was less than 47 times.

Since the wiring patterns of the Examples 1 to 14 did not break at 100% elongation, it is clear that they do not break even when they are elongated at a temperature of 160 degrees C., for example. Furthermore, it should be noted that when base materials of the Examples, on which wiring patterns were formed, was tried to be bent before elongation, no significant effect on the electrical resistance values was observed before and after the bending, and there were no break.

On the other hand, the conductive pastes of the Comparative Examples 1 and 2 contain a thermoplastic resin (B) (the resins E and F) having a glass transition temperature of 98 degrees C. or less as the thermoplastic resin. The Comparative Example 1 was broken w % ben the wiring pattern was stretched by 13%, and the Comparative Example 2 was broken when the wiring pattern was stretched by 80%.

From the above explanation, it became clear that, by using the conductive pastes of the Examples 1 to 14, an electric wiring with low possibility of breaking can be formed even when the electric wiring is stretched and/or bent. Moreover, in the Examples 1 to 14, even if the wiring pattern was stretched by 100% at a temperature of 160 degrees C., there was no breaking and no significant effect on bending was observed. Therefore, if the conductive pastes of the Examples 1 to 14 are used, it can be said that an electric wiring with low possibility of breaking can be formed even when the electric wiring of an electric circuit and/or an electronic circuit are formed using molding.

TABLE 1

|  |  | Example 1 | Example 2 | Example 3 | Example 4 | Example 5 | Example 6 | Example 7 | Example 8 |
|---|---|---|---|---|---|---|---|---|---|
| (A) Conductive Particles | Conductive particles A | 100 | 100 | 100 | 100 | 100 | 100 | 100 | |
|  | Conductive particles B |  |  |  |  |  |  |  | 100 |
|  | Conductive particles C |  |  |  |  |  |  |  |  |
|  | Conductive particles D |  |  |  |  |  |  |  |  |
|  | Conductive particles E |  |  |  |  |  |  |  |  |
| (B) Thermoplastic Resin | Resin A | 17.6 |  |  | 4.4 |  |  |  |  |
|  | Resin B |  | 17.6 |  | 4.4 | 13.2 | 2.0 | 25.0 | 17.6 |
|  | Resin C |  |  | 17.6 |  |  |  |  |  |
|  | Resin D |  |  |  |  |  |  |  |  |
|  | Resin E |  |  |  |  | 4.4 |  |  |  |
|  | Resin F |  |  |  |  |  |  |  |  |
| (C) Solvent | Solvent A | 50.4 | 50.4 | 56.6 | 27.2 | 14.0 | 18.0 | 83.3 | 50.4 |
|  | Solvent B |  |  |  |  | 4.7 |  |  |  |
|  | Solvent C |  |  |  |  |  |  |  |  |

TABLE 1-continued

|  | Example 1 | Example 2 | Example 3 | Example 4 | Example 5 | Example 6 | Example 7 | Example 8 |
|---|---|---|---|---|---|---|---|---|
| Solvent D |  |  |  |  |  |  |  |  |
| Solvent E |  |  |  |  |  |  |  |  |
| Solvent F |  |  |  |  |  |  |  |  |
| Paste viscosity (Pa · s) | 28 | 485 | 534 | 175 | 450 | 117 | 67 | 520 |
| Initial resistivity (micro-ohm · cm) | 82.4 | 56.6 | 89.4 | 27.6 | 98.5 | 37.9 | 268 | 92.4 |
| Rate of change in resistance at 100% stretch against initial resistance (times) | 7 | 16 | 25 | 47 | 54 | 20 | 31 | 10 |
| Extension rate when wire is broken (%) | — | — | — | — | — | — | — | — |

TABLE 2

|  |  | Example 9 | Example 10 | Example 11 | Example 12 | Example 13 | Example 14 | Comparative Example 1 | Comparative Example 2 |
|---|---|---|---|---|---|---|---|---|---|
| (A) Conductive Particles | Conductive particles A |  |  |  | 100 | 100 | 100 | 100 | 100 |
|  | Conductive particles B |  |  |  |  |  |  |  |  |
|  | Conductive particles C | 100 |  |  |  |  |  |  |  |
|  | Conductive particles D |  | 100 |  |  |  |  |  |  |
|  | Conductive particles E |  |  | 100 |  |  |  |  |  |
| (B) Thermoplastic Resin | Resin A |  |  |  |  | 17.6 |  |  |  |
|  | Resin B | 17.6 | 17.6 | 17.6 | 17.6 |  |  |  |  |
|  | Resin C |  |  |  |  |  |  |  |  |
|  | Resin D |  |  |  |  |  | 17.6 |  |  |
|  | Resin E |  |  |  |  |  |  | 17.6 |  |
|  | Resin F |  |  |  |  |  |  |  | 17.6 |
| (C) Solvent | Solvent A | 50.4 | 50.4 | 50.4 |  |  | 50.4 |  |  |
|  | Solvent B |  |  |  |  |  |  | 50.4 |  |
|  | Solvent C |  |  |  |  |  |  |  |  |
|  | Solvent D |  |  |  |  |  |  |  | 50.4 |
|  | Solvent E |  |  |  | 50.4 |  |  |  |  |
|  | Solvent F |  |  |  |  | 50.4 |  |  |  |
| Paste viscosity (Pa · s) |  | 372 | 329 | 255 | 43 | 38 | 36 | 509 | 44 |
| Initial resistivity (micro-ohm · cm) |  | 136 | 193 | 101 | 94.4 | 77.0 | 66.3 | 66.7 | 66.6 |
| Rate of change in resistance at 100% stretch against initial resistance (times) |  | 7 | 30 | 25 | 10 | 7 | 14 | Breaking | Breaking |
| Extension rate when breaking occurs (%) |  | — | — | — | — | — | — | 13% | 80% |

TABLE 3

| Conductive particles | Model number | Manufacturing company | Particle shape | Average particle size (D 50) (μm) | TAP Density (g/cm$^3$) | BET specific surface area (m$^2$/g) |
|---|---|---|---|---|---|---|
| Conductive particles A | P791-36 | Metalor Technologies | Amorphous | 0.98 | 2.3 | 1.9 |
| Conductive particles B | P971-24 | Metalor Technologies | Indefinite form | 0.92 | 2.4 | 2.7 |
| Conductive particles C | SF70A | AMES GOLDSMITH | Scale-shaped | 1.66 | 3.2 | 1.4 |
| Conductive particles D | AA-40717 | Metalor Technologies | Scale-shaped | 3.7 | 3.5 | 1.6 |
| Conductive particles E | AA-40719 | Metalo Technologies | Scale-shaped | 5.7 | 2.6 | 1.0 |

TABLE 4

| Resin | Model number | Manufacturing company | Type | Molecular weight | Glass transition temperature (deg. C.) |
|---|---|---|---|---|---|
| Resin A | PCZ-200 | Mitsubishi Gas Chemicals | Poly (4,4'-cyclohexylidenediphenyl) carbonate | 20,000 | 184 |
| Resin B | PCZ-500 | Mitsubishi Gas Chemicals | Poly (4,4'-cyclohexylidenediphenyl) carbonate | 50,000 | 186 |
| Resin C | PCZ-800 | Mitsubishi Gas Chemistry | Poly (4,4'-cyclohexylidenediphenyl) carbonate | 80,000 | 188 |
| Resin D | FPC-2136 | Mitsubishi Gas Chemicals | Copoly {2,2-bis (4-hydroxyphenyl) propane/2,2-bis (4-hydroxy-3-methylphenyl) propane} carbonate | 20,000 | 141 |
| Resin E | PH-890 | Dainichika | Polycarbonate-type polyurethane | 30,000 | 61 |
| Resin F | PKFE | Gabriel | phenoxy resin | 60,000 | 98 |

TABLE 5

| Solvent | Type | Boiling point (deg. C.) |
|---|---|---|
| Solvent A | Isophorone | 215° C. |
| Solvent B | 3 Methoxy N,N dimethylpropanamide | 215° C. |
| Solvent C | Benzyl alcohol | 205° C. |
| Solvent D | Butyl Carbitol | 247° C. |
| Solvent E | Ethyl Carbitol Acetate | 217° C. |
| Solvent F | Tetraglime | 275° C. |

The invention claimed is:

1. A conductive composition comprising:
   conductive particles;
   a thermoplastic resin; and
   a solvent,
   wherein a glass transition temperature of the thermoplastic resin is 140 to 200 degrees C., and
   wherein the thermoplastic resin comprises poly (4, 4'-cyclohexylidenediphenyl) carbonate.

2. The conductive composition according to claim 1, wherein a boiling point of the solvent is 200 degrees C. or more.

3. The conductive composition according to claim 1, wherein the solvent comprises at least one selected from the group consisting of isophorone, 3-methoxy N, N-dimethylpropanamide, benzyl alcohol, butyl carbitol, ethyl carbitol acetate and tetraglyme.

4. The conductive composition according to claim 1, wherein a weight ratio of the conductive particles to the thermoplastic resin (weight of the conductive particles: weight of the thermoplastic resin) is in a range of 99:1 to 70:30.

5. The conductive composition according to claim 1, wherein the conductive particles are silver particles.

6. A conductive paste comprising the conductive composition according to claim 1.

7. The conductive paste according to claim 6, wherein the conductive paste is for forming a flexible electric circuit body.

8. The conductive paste according to claim 6, wherein the conductive paste is for In-Mold Electronics.

9. An electric circuit comprising a cured product of the conductive paste according to claim 6.

10. A flexible electric circuit body comprising:
    a flexible base material; and
    the electric circuit according to claim 9 arranged on the flexible base material.

11. A method of producing a molded body comprising:
    forming an electric circuit on a surface of a flexible base material using the conductive paste according to claim 6; and
    forming the molded body by molding the flexible base material, on which the electric circuit was formed, and a resin for molding.

12. The conductive composition according to claim 1, wherein the solvent comprises at least one selected from the group consisting of 3-methoxy N, N-dimethylpropanamide, butyl carbitol, ethyl carbitol acetate and tetraglyme.

* * * * *